United States Patent [19]

Barlow

[11] 4,085,405
[45] Apr. 18, 1978

[54] ANTENNA MATCHING NETWORK

[75] Inventor: Edson L. Barlow, Rochester, Mich.

[73] Assignee: MHz Enterprises, Inc., Utica, Mich.

[21] Appl. No.: 740,313

[22] Filed: Nov. 9, 1976

[51] Int. Cl.² .......................... H01Q 1/50; H01Q 9/00
[52] U.S. Cl. .................................... 343/858; 343/750; 343/850; 343/894
[58] Field of Search ............... 343/703, 715, 745, 750, 343/850, 852, 858, 894; 325/172, 176, 178, 383; 334/36

[56] References Cited

U.S. PATENT DOCUMENTS

| 2,485,171 | 10/1949 | Seright | 325/172 |
| 2,840,697 | 6/1958 | Ocko | 325/176 |
| 3,381,222 | 4/1968 | Gray | 343/703 |
| 3,725,942 | 4/1973 | Ukmar | 343/745 |

Primary Examiner—Alfred E. Smith
Assistant Examiner—Harry E. Barlow
Attorney, Agent, or Firm—Mason, Kolehmainen, Rathburn & Wyss

[57] ABSTRACT

An antenna matching network for matching a citizens band radio transceiver to a standard automotive whip or windshield antenna utilizes a matching section for matching the nominal 50 ohm output of the citizens band transceiver to the generally lower impedance of the automotive antenna. A trap tuned to the citizens band prevents the output of the citizens band transmitter from damaging the automotive broadcast receiver when transmitting. The matching section is tunable over a sufficient range to match the citizens band transceiver to most automotive antennas, and a dual sensitivity indicator is utilized to aid the operator in tuning the matching network to provide optimum matching without the use of specialized equipment.

3 Claims, 2 Drawing Figures

ANTENNA MATCHING NETWORK

BACKGROUND OF THE INVENTION

A. Field of the Invention

This invention relates generally to matching networks and more particularly to a matching network for matching a citizens band transceiver or the like to a standard automotive antenna, the matching network being a type that is readily tunable by a novice without the use of specialized equipment.

B. Description of the Prior Art

Antenna matching networks are known. Such antenna matching networks have various configurations, and are used in a variety of different types of communications equipment for matching the communications equipment to various antennas. The matching networks are usually located inside the communications equipment and are used to match the equipment to antennas having a standard impedance, such as 50 ohms. When the equipment is to be matched to antennas having a wider range of impedances, a separate unit having a greater tuning range than the unit incorporated in most communications equipment is interposed between the antenna and the communications equipment to provide the desired match.

While such prior art devices do a satisfactory job of matching an antenna to communications equipment, the tuning of such devices requires the use of specialized equipment such as standing wave ratio meters or directional couplers. For this reason, external matching networks have generally not been used, and instead, antennas having impedances compatible with the communications equipment have been employed. These antennas tend to detract from the appearance of a car and furthermore, increase the probability of theft of the communications equipment, particularly citizens band equipment, since such antennas are readily visible and tend to alert theives that a communications radio is present in the car.

SUMMARY OF THE INVENTION

Accordingly, it is an object of the present invention to provide an antenna matching network that overcomes many of the problems associated with the prior art.

It is another object of the present invention to provide an antenna matching network suitable for citizens band operation.

It is yet another object of the present invention to provide an antenna matching network that is readily tunable by a novice operator without the use of specialized equipment.

It is still another object of the present invention to provide an antenna matching network that matches both a citizens band transceiver and a standard automotive broadcast receiver to a standard automotive antenna.

It is still another object of the present invention to provide a matching network that permits both a citizens band transceiver and an automotive broadcast receiver to be operated simultaneously from a standard automotive antenna.

It is still another object of the present invention to provide a low cost antenna matching network that eliminates the need for a specialized citizens band antenna.

In accordance with a preferred embodiment of the present invention, an L-section antenna matching network is interposed between a citizens band transceiver and a standard automotive antenna. The L-section matching network is tunable over a sufficient range to match most automotive antennas to the 50 ohm output of the citizens band transceiver. In addition, a tuning indicator light is connected across part of the series portion of the L-section for monitoring the power applied to the antenna. A sensitivity switch is included for rendering the indicator light more sensitive when a large mismatch exists between the antenna and the transceiver, and for reducing the sensitivity of the indicator as a closer match is approached. This prevents damage to the indicator light, and reduces the amount of power drawn from the circuit. A trap circuit is interposed between the antenna and the standard broadcast receiver to prevent the broadcast receiver from being damaged by the output from the citizens band transmitter. The trap circuit also prevents the broadcast receiver from undesirably loading the antenna in the range of frequencies around the citizens band, thus preventing the broadcast receiver from adversely affecting the sensitivity of the citizens band receiver. The entire assembly is housed in a small box that readily fits on or under the dashboard of most vehicles.

These and other objects and advantages of the present invention may readily be ascertained from the following detailed description and attached drawings, wherein:

FIG. 1 is a detailed schematic diagram of the antenna matching network of the present invention; and FIG. 2 is a perspective view showing the physical construction of the matching network.

DETAILED DESCRIPTION OF THE PREFERRED EMBODIMENT

Figure 1:
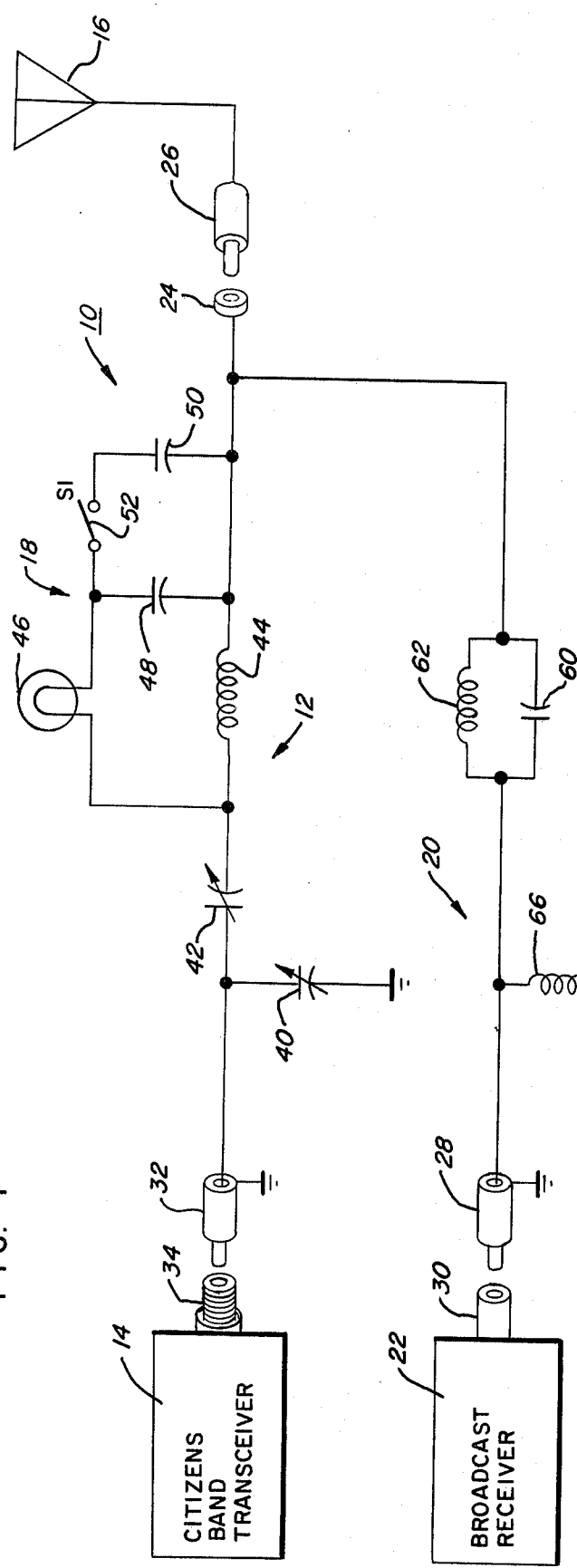
Figure 2:
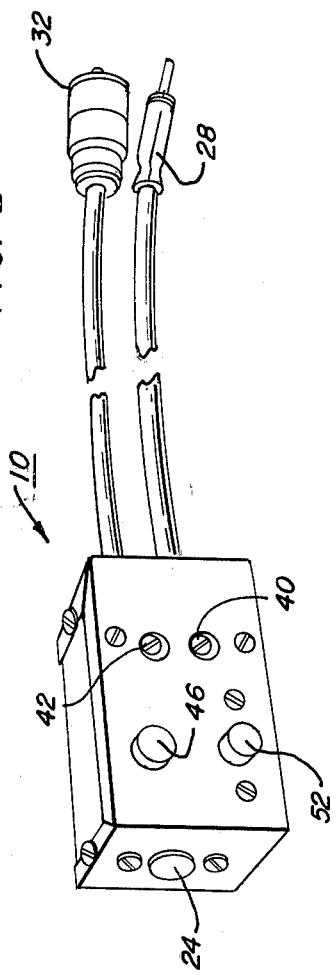

Referring now to the Figures, with particular attention to FIG. 1, the matching network according to the invention, generally designated by the reference numeral 10, includes an L-section matching section 12 for matching a communications transceiver such as a citizens band transceiver 14 having a transmitter and a receiver to a standard automotive antenna 16. The network 10 also includes a tuning indicator circuit 18 for monitoring the tuning of the antenna matching network 12. A blocking circuit comprising trap circuit 20 tuned to the citizens band couples the antenna 16 to a standard broadcast receiver 22 which may be an AM or an AM/FM broadcast receiver of the type commonly found in automobiles. An antenna jack 24 (FIGS. 1 and 2) receives a standard antenna plug 26 of the types used by the automotive industry, and serves electrically to connect the antenna 16 to the matching network 10. A plug 28, similar to the plug 26 plugs into an antenna jack 30 in the broadcast receiver 22 and connects the broadcast receiver 22 to the matching network 10. A second plug 32, preferably a UHF plug engages a mating connector 34 on the transceiver 14. The jack 24 and the plugs 28 and 32 mate with the types of plugs and jacks most commonly used on citizens band transceivers, broadcast receivers and antennas to permit the matching network 10 to be easily plugged into any system. The jack 24 and the plugs 28 and 32 are all different, thus making it impossible incorrectly to connect the matching network 10 to the antenna 16, the transceiver 14 and the braodcast receiver 22.

The antenna matching section 12 is, in this embodiment, an L-section matching circuit including a pair of variable capacitors 40 and 42 and an inductor 44. The matching section 12 matches the impedance of the transceiver 14 (nominally 50 ohms) to the impedance of the antenna 16. The impedance of the typical automotive antenna 16 is generally on the order of 2 ohms at citizens band, but tests have indicated that the impedance of automotive antennas varies over a broad range from approximately 0.1 ohms to approximately 37 ohms. In order to match the transceiver 14 to such a relatively wide range of impedances, the capacitor 40 is made variable over a range of 105-580 picofarads and the capacitor 42 is made variable over a range of 25-280 picofarads in this embodiment. The inductance of the inductor 44 is 1 microhenry. It should, however, be noted that the design of the circuit may be renormalized and other values of inductance and capacitance used.

The tuning indicator circuit 18 includes an indicator light 46 (a No. 49 bulb in this embodiment) connected across the inductor 44 through a pair of one picofarad capacitors 48 and 50. A switch 52 is used selectively to switch the capacitor 50 into or out of the circuit in order to adjust the sensitivity of the indicator 18. The size of the bulb 46 is selected to provide adequate sensitivity and brightness without drawing excessive power from the circuit.

The trap circuit 20 includes a capacitor 60 and an inductor 62 forming a parallel tuned circuit tuned to the nominal transmission frequency of the communications transceiver, or approximately 27 mHz for citizens band equipment. A capacitor 64 and an inductor 66 form a series tuned circuit, also tuned to the transmission frequency of the transceiver 14, or 27 mHz. The parallel tuned circuit has a high impedance at 27 mHz and serves to prevent energy from the citizens band transmitter from damaging the broadcast receiver 22. In addition, the parallel tuned circuit prevents the broadcast receiver 22 from loading the antenna 16 over a range of frequencies around 27 mHz, and thus prevents the sensitivity of the citizens band receiver from being degraded. The series of tuned circuit further reduces the 27 mHz signal applied to the broadcast receiver 22 by shunting any radiated signals or signals passed by the parallel tuned circuit to ground. The combination of the parallel and series tuned circuits permits the citizens band transceiver 14 and the broadcast receiver 22 to be operated simultaneously in most cases, but in some cases the volume of the broadcast receiver may have to be tuned down when transmitting. In the illustrated combination, the capacitors 60 and 64 each have a value of 15 picofarads and the inductors 62 and 66 have values of 2.3 microhenries, but other combinations giving a resonant frequency substantially equal to the transmission frequency of the transceiver 14 may be used.

Installation of the matching network 10 is accomplished simply by plugging the plug 26 connected to the automotive antenna 16 into the jack 24 (FIG. 2) of the matching network 10. The UHF connector 32 is connected to the jack 34 of the transceiver 14, and the plug 28 is plugged into the broadcast receiver 22. After the matching network 10 is installed, it is tuned as follows. First it is coarse tuned by opening the squelch of the citizens band receiver and alternately adjusting the capacitors 40 and 42 while listening to the audio output of the receiver until the noise from the receiver reaches a peak. Final tuning is accomplished by keying the citizens band transmitter and alternately adjusting the capacitors 40 and 42 until the indicator light 46 reaches maximum brilliance. If the light 46 does not light or is very dim, the push-button switch 52 is depressed. This connects the capacitor 50 in parallel with the capacitor 48 and increases the coupling of energy into the indicator light 46. The capacitors 40 and 42 are then alternately tuned until the indicator light 46 reaches sufficient brightness to permit the switch 52 to be released, after which the tuning of the capacitors 40 and 42 is continued until maximum brilliance of the indicator light 46 is achieved. When this point is reached, the output of the citizens band transceiver 14 is matched to the automotive antenna 16.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A matching network for coupling a broadcast receiver and a communications transceiver having a transmitter and a receiver to a common automotive broadcast antenna, comprising:

a tunable matching section including at least a series arm electrically connectable between the communications transceiver and the broadcast antenna;

an indicator light electrically coupled to said series arm, said indicator light being responsive to the flow of power from said transceiver to said antenna and indicating the state of tune of said matching section;

a blocking circuit connectable between said antenna and said broadcast receiver, said blocking circuit being operative to attenuate the flow of signals having frequencies within the operating frequency range of said transmitter while permitting the flow of broadcast signals from said antenna to said broadcast receiver;

a housing surrounding said matching network and means extending from said housing for disconnectably electrically connecting said matching network to said broadcast antenna, said broadcast receiver and to said transceiver, said indicator light being affixed to said housing in a manner rendering it visible from outside of said housing and said matching section being tunable from outside of said housing;

a sensitivity switch electrically coupled to said indicator light, said sensitivity switch being operative from outside of said housing to increase the sensitivity of said indicator light to the flow of power between said transceiver and said antenna to thereby increase the brightness of said indicator light; and a first capacitor coupling said matching network to said indicator light and a second capacitor coupled to said sensitivity switch, said sensitivity switch being operative to connect said second capacitor in a parallel circuit with said first capacitor to increase the sensitivity of said indicator light.

2. A matching network as recited in claim 1 wherein said matching section is an L-section having a series arm and a shunt arm, and wherein said indicator light is electrically coupled across at least a portion of said series arm.

3. A matching network as recited in claim 2 wherein said blocking circuit includes a parallel tuned circuit tuned to the range of frequencies transmitted by said transceiver connectable between said broadcast receiver and said antenna, and a series tuned circuit tuned to the range of frequencies transmitted by said communications transceiver connectable to said broadcast receiver, said series tuned circuit shunting signals having frequencies in the range of transmission of said citizens band transceiver away from said broadcast receiver.

* * * * *